(12) United States Patent
Yamada (10) Patent No.: US 8,433,552 B2
(45) Date of Patent: Apr. 30, 2013

(54) CIRCUIT SIMULATION METHOD

(75) Inventor: Kenta Yamada, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 415 days.

(21) Appl. No.: 12/882,714

(22) Filed: Sep. 15, 2010

(65) Prior Publication Data

US 2011/0066418 A1 Mar. 17, 2011

(30) Foreign Application Priority Data

Sep. 17, 2009 (JP) .................................. 2009-215973

(51) Int. Cl.
*G06F 17/50* (2006.01)

(52) U.S. Cl.
USPC .................. 703/14; 703/13; 703/15; 703/16; 703/17; 716/115; 716/124; 716/136; 716/113; 257/43; 257/532; 257/296; 257/382

(58) Field of Classification Search .................... 703/13, 703/14, 15, 16, 17; 716/115, 124, 136, 113; 257/43, 532, 296, 382

See application file for complete search history.

(56) References Cited

U.S. PATENT DOCUMENTS

| | | | | |
|---|---|---|---|---|
| 6,212,492 | B1 * | 4/2001 | Kuge ................................ | 703/15 |
| 2008/0059926 | A1 * | 3/2008 | Mori .................................. | 716/5 |
| 2008/0104554 | A1 * | 5/2008 | Kobayashi et al. ................ | 716/4 |

FOREIGN PATENT DOCUMENTS

JP 2008-204127 A 9/2008

OTHER PUBLICATIONS

Dixit et al. Analysis of the Parasitic S/D Resistance in Multiple-Gate FETs IEEE Transactions on Electron Devices, vol. 52, No. 6, Jun. 2005.*
Stephen J. Proctor, Loren W. Linholm, Jeffrey A. Mazer Direct Measurements of Interacial Contact Resistance, End Contact Resistance, and Interfacial Contact Layer Uniformity IEEE Transactions on Electron Devices, vol. ED-30, Nov. 1983.*
Robert C. Y. Fang, Kung-Yen Su, Jamves Juen Hsu A Two-Dimensional Analysis of Sheet and Contact Resistance Effects in Basic Cells of Gate-Array Circuits IEEE Journal of Solid-State Circuit, vol. SC-20, Apr. 1985.*

* cited by examiner

*Primary Examiner* — Saif Alhija
*Assistant Examiner* — Cuong Luu
(74) *Attorney, Agent, or Firm* — Foley & Lardner LLP (57) ABSTRACT

A exemplary aspect of the present invention is a simulation method for a semiconductor circuit that includes: a semiconductor resistor; a plurality of contacts arranged at regular intervals in a longitudinal direction and in a width direction of the semiconductor resistor on a terminal region of the semiconductor resistor; and a wiring line formed on the plurality of contacts, the simulation method including: defining a ratio of a parasitic-resistance by the semiconductor resistor between two of the contacts neighboring in the longitudinal direction to a resistance of one of the plurality of contacts as a constant k; and modeling a parasitic-resistance net by using the constant k, the parasitic-resistance net including the terminal region of the semiconductor resistor and the plurality of contacts.

7 Claims, 7 Drawing Sheets

Fig. 5C $R_{AB} = R_{AC} = Ra + Rb = rctarr$

Fig. 6
WHEN nctl IS ODD

Fig. 7

CIRCUIT SIMULATION METHOD

This application is based upon and claims the benefit of priority from Japanese patent application No. 2009-215973, filed on Sep. 17, 2009, the disclosure of which is incorporated herein in its entirety by reference.

BACKGROUND

1. Field of the Invention

The present invention relates to a circuit simulation method, and more particularly, to a circuit simulation method for a circuit having a semiconductor resistor.

2. Description of Related Art

Along with miniaturization of semiconductor integrated circuits, an area of logic circuits is reduced, whereas, an area of analog circuits is not necessarily reduced. Therefore, reduction of the area of analog circuits has become an increasingly critical issue for cost reduction. A cause of an impediment to reducing the area of analog circuits is that it is difficult to reduce the area of resistors. Here, a terminal region of the resistor is connected to a wiring line through a plurality of contacts which are regularly arranged. A resistance of the terminal region of the resistor (hereinafter referred to as "terminal parasitic-resistance") varies depending on the shape of the terminal region, the number and layout of contacts, or the like. Therefore, it is difficult to estimate the value of the resistance precisely.

When there is an estimation error of the terminal parasitic-resistance, it is necessary to enlarge a margin for the estimation error or to design the layout in which the estimation error is negligible. In each case, the circuit area increases. In particular, a resistance of contacts which are one of major components of the terminal parasitic-resistance increases at an accelerated rate along with the recent miniaturization. Therefore, the resistance of the terminal parasitic-resistance becomes large relative to a resistance of the main body of the resistor. Thus, the estimation error of the terminal parasitic-resistance has become an increasingly significant issue.

In general, to estimate a terminal parasitic-resistance, it is necessary to extract a complex parasitic-resistance net by using an LPE (Layout Parameter Extraction) tool after lay out design. Further, to shorten a circuit simulation time, a circuit reduction needs to be performed by a sequential hand calculation or a circuit reduction tool. However, such methods require time and effort or include estimation errors due to an LPE tool. For example, Japanese Unexamined Patent Application Publication No. 2008-204127 relates to a circuit reduction technique.

SUMMARY

When reviewing the circuit design after estimation using an LPE tool, the design efficiency is significantly lowered. Thus, in the circuit design stage before the layout design, the terminal parasitic-resistance is required to be estimated. In this case, since the LPE tool cannot be used, the terminal parasitic-resistance has simply been estimated up to now. Specifically, the terminal parasitic-resistance is considered to be inversely proportional to the number of contacts. However, in fact, contacts far from the main body of the resistor do not contribute to reducing the terminal parasitic-resistance due to the parasitic-resistance of the resistor between contacts, which may cause the estimation error. Finally, circuit simulation results after the layout design deviate from design values, and it is possibly necessary to review the circuit design and the layout design.

A exemplary aspect of the present invention is a simulation method for a semiconductor circuit that includes:
a semiconductor resistor;
a plurality of contacts arranged at regular intervals in a longitudinal direction and in a width direction of the semiconductor resistor on a terminal region of the semiconductor resistor; and
a wiring line formed on the plurality of contacts,
the simulation method including:
defining a ratio of a parasitic-resistance by the semiconductor resistor between two of the plurality of contacts neighboring in the longitudinal direction to a resistance of one of the plurality of contacts as a constant k; and
modeling a parasitic-resistance net by using the constant k, the parasitic-resistance net including the terminal region of the semiconductor resistor and the plurality of contacts.

In the present invention, by defining the ratio of a parasitic-resistance of the semiconductor resistor between the two contacts neighboring in the longitudinal direction to a resistance of one of the plurality of contacts as the constant k, the parasitic-resistance net of the terminal region is modeled. This makes it possible to estimate the terminal parasitic-resistance of the semiconductor resistor precisely.

According to the exemplary aspects of the present invention, it is possible to provide a circuit simulation method capable of accurate estimating a terminal parasitic-resistance of a semiconductor resistor.

BRIEF DESCRIPTION OF THE DRAWINGS

The above and other exemplary aspects, advantages and features will be more apparent from the following description of certain exemplary embodiments taken in conjunction with the accompanying drawings, in which.

DETAILED DESCRIPTION OF THE EXEMPLARY EMBODIMENTS

Exemplary embodiments of the present invention will be described in detail below with reference to the accompanying drawings. Note that the present invention is not limited to exemplary embodiments described below. The following description and the accompanying drawings are appropriately simplified to clarify the explanation.

First Exemplary Embodiment

Figure 1A:
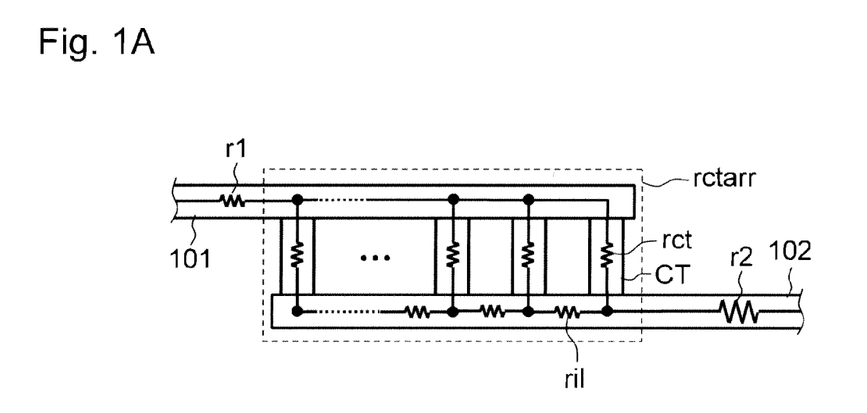
FIG. 1A is a longitudinal sectional view for explaining a terminal parasitic-resistance of a semiconductor resistor which is modeled in a circuit simulation method according to a first exemplary embodiment.

A terminal parasitic-resistance of a semiconductor resistor which is modeled in a circuit simulation method according to a first exemplary embodiment of the present invention is described hereinafter with reference to FIGS. 1A to 1C. FIG. 1A is a longitudinal sectional view for explaining a terminal parasitic-resistance of a semiconductor resistor which is modeled in a circuit simulation method according to the first exemplary embodiment. As shown in FIG. 1A, one terminal region of a resistor 102 is connected to a wiring line 101 through a plurality of contacts CT.

Figure 1B:
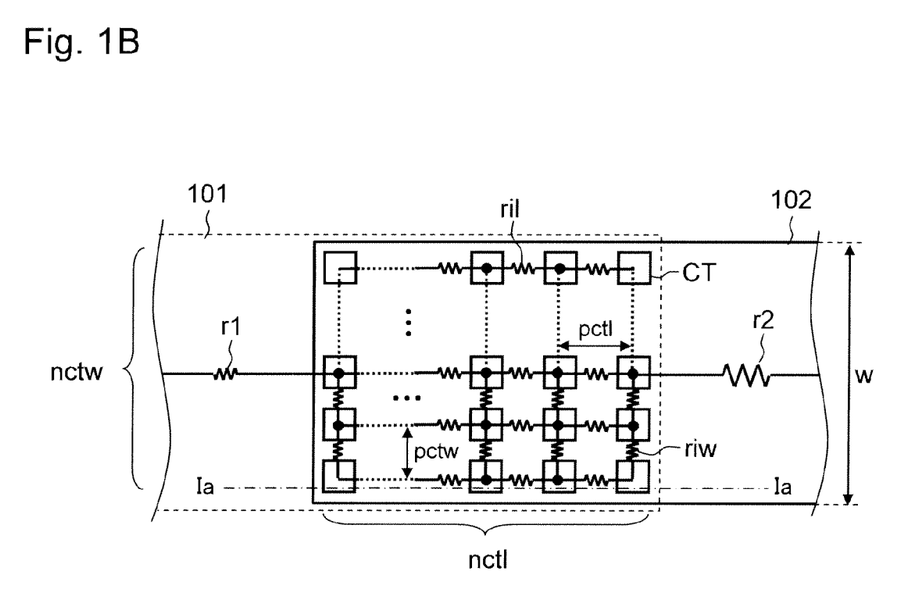
FIG. 1B is a plan view for explaining a terminal parasitic-resistance of a semiconductor resistor which is modeled in the circuit simulation method according to the first exemplary embodiment.

FIG. 1B is a plan view for explaining the terminal parasitic-resistance of the semiconductor resistor which is modeled in the circuit simulation method according to the first exemplary embodiment. As shown in FIG. 1B, the contacts CT are arranged on the resistor 102 having a width w. Specifically, nctl number of contacts CT are arranged in a longitudinal direction of the resistor 102, and nctw number of contacts CT are arranged in a width direction of the resistor 102. Thus, a total of nctl×nctw number of contacts CT are arranged. When the terms "longitudinal direction" and "width direction" are used singly in this specification hereinafter, the terms respectively refer to the longitudinal direction and the width direction of the resistor 102.

Here, the contacts CT are arranged at regular intervals with a pitch pctl in the longitudinal direction and with a pitch pctw in the width direction. In FIG. 1B, the wiring line 101 is indicated by a broken line. FIG. 1A is a longitudinal sectional view taken along the line Ia-Ia of FIG. 1B. Note that the resistor 102 according to the first exemplary embodiment has two terminal regions at both ends. Although only one terminal region is shown in the figures, the other terminal region has a structure similar to that of FIGS. 1A and 1B.

Here, the wiring line 101 is composed of a good conductor such as Cu (copper) or Al (aluminum). The resistor 102 is a semiconductor resistor such as a polycide resistor or a silicide-block poly resistor. The contacts CT are composed of W (tungsten), for example. Here, ρspol represents a sheet resistance of the resistor 102.

FIGS. 1A and 1B illustrate components including the resistor 102, the contacts CT, and the wiring line 101, and a circuit diagram superimposed thereon. Here, in FIGS. 1A and 1B, r1 represents a resistance of the main body of the wiring line 101, rct represents a resistance of one of the contacts CT, ril represents a parasitic-resistance of the resistor 102 between the contacts CT neighboring in the longitudinal direction, riw represents a parasitic-resistance of the resistor 102 between the contacts CT neighboring in the width direction, and r2 represents a resistance of the main body of the resistor 102.

Figure 1C:
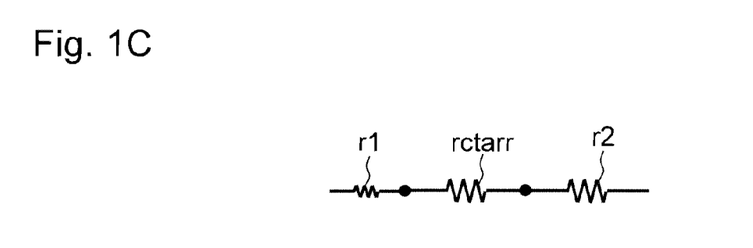
FIG. 1C is an equivalent circuit diagram of a terminal region of a semiconductor resistor which is modeled in the circuit simulation method according to the first exemplary embodiment.

FIG. 1C is an equivalent circuit diagram of a terminal parasitic-resistance rctarr of the resistor 102 according to the first exemplary embodiment. One end of the terminal parasitic-resistance rctarr is connected to the resistance r1 of the main body of the wiring line 101. The other end of the terminal parasitic-resistance rctarr is connected to the resistance r2 of the main body of the resistor 102. The terminal parasitic-resistance rctarr is synthesized from the resistance rct of one contact CT, the parasitic-resistance ril of the resistor 102 between the contacts CT neighboring in the longitudinal direction, and the parasitic-resistance riw of the resistor 102 between the contacts CT neighboring in the width direction shown in FIGS. 1A and 1B. Note that the resistivity of the wiring line 101 is smaller than that of the resistor 102 by two or more orders of magnitude. Thus, the parasitic-resistance of the wiring line 101 between the contacts CT is neglected.

As mentioned above, in the circuit simulation method according to the first exemplary embodiment, a complicated parasitic-resistance of the terminal region composed of a number of nodes is precisely modeled as a single terminal parasitic-resistance rctarr by a mathematical technique. This makes it possible to realize a highly-accurate and high-speed circuit simulation. As a matter of course, the circuit simulation method according to the first exemplary embodiment is implemented by executing circuit simulation software on a circuit simulation apparatus (hardware).

Figure 2:
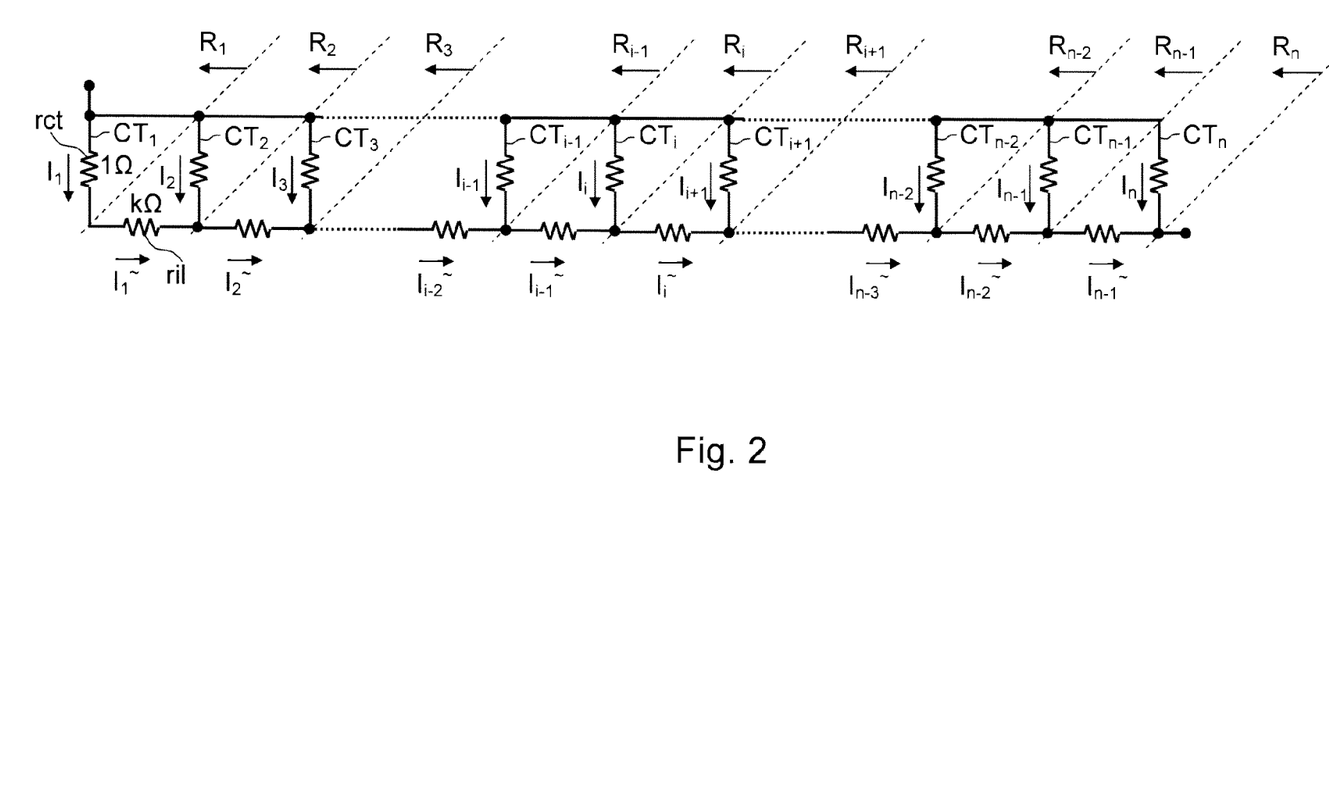
FIG. 2 is a circuit diagram for deriving a model formula in the circuit simulation method according to the first exemplary embodiment.

Next, a method for deriving a model formula used for the circuit simulation method according to the first exemplary embodiment is described hereinafter. Here, a resistance of a row of contacts in the width direction is considered to be simply inversely proportional to the arrangement number nctw of the contacts CT in the width direction. Therefore, a two-dimensional structure corresponding to the longitudinal sectional view shown in FIG. 1A is essentially modeled. FIG. 2 is a circuit diagram for deriving a model formula in the circuit simulation method according to the first exemplary embodiment. FIG. 2 shows each resistance rct of contacts $CT_1$ to $CT_n$ and the parasitic-resistance ril of the resistor 102 between the contacts CT neighboring in the longitudinal direction.

Here, assuming rct=1Ω, ril=kΩ, a ratio of the terminal parasitic-resistance rctarr, or a total resistance, to the resistance rct of one contact CT is calculated. Here, a ratio of the parasitic-resistance ril of the resistor 102 between the contacts CT in the longitudinal direction to the resistance rct of one contact CT is expressed as ril/rct=k.

With regard to a current $I_1$ which flows through the contact $CT_1$ farthest from the resistor 102, $I_1=1$ is assumed. However, the value of the current $I_1$ is arbitrary since it is cancelled out in the calculation process of the terminal parasitic-resistance rctarr. As a matter of course, with regard to a current $I_1\tilde{}$ which flows through the parasitic-resistance ril of the resistor 102 between the contacts $CT_1$ and $CT_2$, $I_1\tilde{}=1$ holds. Further, $I_1 \times 1 + I_1\tilde{} \times k = I_2 \times 1$ holds according to Kirchhoff's law. Thus, $I_2=k+1$ is obtained. With regard to a current $I_2\tilde{}$ which flows through the parasitic-resistance ril of the resistor 102 between the contacts $CT_2$ and $CT_3$, $I_2\tilde{}=I_1\tilde{}+I_2$ is obtained. By repeating such calculations, the following recurrence formula (1) is obtained.

$$\begin{cases} I_1 = 1 \\ I_1^\sim = 1 \\ I_2 = k+1 \\ I_2^\sim = k+2 \\ \ldots \\ I_{i-1}^\sim = I_{i-1} + I_{i-2}^\sim \\ I_i = k \times I_{i-1}^\sim + I_{i-1} \\ I_i^\sim = I_i + I_{i-1}^\sim \\ I_{i+1} = k \times I_i^\sim + I_i \\ \ldots \end{cases} \quad (1)$$

Here, as shown in FIG. 2, with regard to a total resistance Ri from the first contact $CT_1$ to the i-th contact $CT_i$, the following formula (2) holds according to Kirchhoff's law.

$$I_i^\sim \times (R_i + k) = I_{i+1} \times 1 \quad (2)$$

Therefore, from the formulae (1) and (2), the following formula (3) is obtained.

$$R_i = \frac{k \times I_i}{I_{i+1} - I_i} \left( = 1 - \frac{I_i - I_{i-1}}{I_{i+1} - I_i} \right) \quad (3)$$

On the other hand, by eliminating terms marked "~" from the formula (1), a three-term recurrence formula like the following formula (4) is obtained.

$$\begin{cases} I_1 = 1 \\ I_2 = k+1 \\ \ldots \\ I_{i+2} = (k+2) \times I_{i+1} - I_i \\ \ldots \end{cases} \quad (4)$$

When $\alpha \neq \beta$ ($\alpha \neq \beta$ holds at any time, since k>0, and $\alpha > \beta$.), the following formulae (5) and (6) are obtained from the general solution of a three-term recurrence formula.

$$\alpha, \beta = \frac{k + 2 \pm \sqrt{k^2 + 4 \times k}}{2} \quad (5)$$

$$I_i = \frac{(\alpha - 1) \times \alpha^{i-1} - (\beta - 1) \times \beta^{i-1}}{\alpha - \beta} \quad (6)$$

From the formulae (3), (5), and (6), the following formula (7) is obtained.

$$R_i = 1 - \frac{\alpha^{i-1} - \beta^{i-1}}{\alpha^i - \beta^i} \quad (7)$$

To apply to the actual layout, a row of contacts in the width direction may be considered in place of one contact CT. Here, a resistance of a row of contacts in the width direction is expressed as the following formula (8).

$$\frac{rct}{nctw} \quad (8)$$

On the other hand, the parasitic-resistance of the resistor 102 between neighboring contact rows in the width direction is expressed as the following formula (9).

$$\rho spol \times \frac{pctl}{w} \quad (9)$$

Thus, from the formulae (8) and (9), a ratio k of the parasitic-resistance ril of the resistor 102 between neighboring contacts CT in the longitudinal direction to the resistance ret of one contact CT, or ril/rct=k, is defined by the following formula (10).

$$k = \left( \rho spol \times \frac{pctl}{w} \right) \div \left( \frac{rct}{nctw} \right) = \frac{\rho spol \times pctl \times nctw}{rct \times w} \quad (10)$$

Ri in the formula (7) is the resistance of a total of "i" rows of contacts, if the resistance of a row of contacts is 1Ω. Finally, from the formulae (7) and (8), the terminal parasitic-resistance rctarr is expressed as the following model formula (11). Here, to distinguish from a second exemplary embodiment mentioned below, Ri in the formula (7) is expressed as fi.

$$rctarr = \frac{f_{nctl} \times rct}{nctw} \quad (11)$$

As mentioned above, in the model formula of the circuit simulation method according to the first exemplary embodiment, the parasitic-resistance ril of the resistor 102 between the contacts CT in the longitudinal direction as well as the resistance rct of the contacts CT is considered. Then, by using the solution of a three-term recurrence formula, a terminal parasitic-resistance net is reduced mathematically and precisely. This makes it possible to estimate the terminal parasitic-resistance rctarr precisely without causing errors due to reduction. Further, since the terminal parasitic-resistance net is expressed as a single terminal parasitic-resistance rctarr, the number of nodes is reduced. Therefore, a circuit simulation time is reduced.

Figure 3:
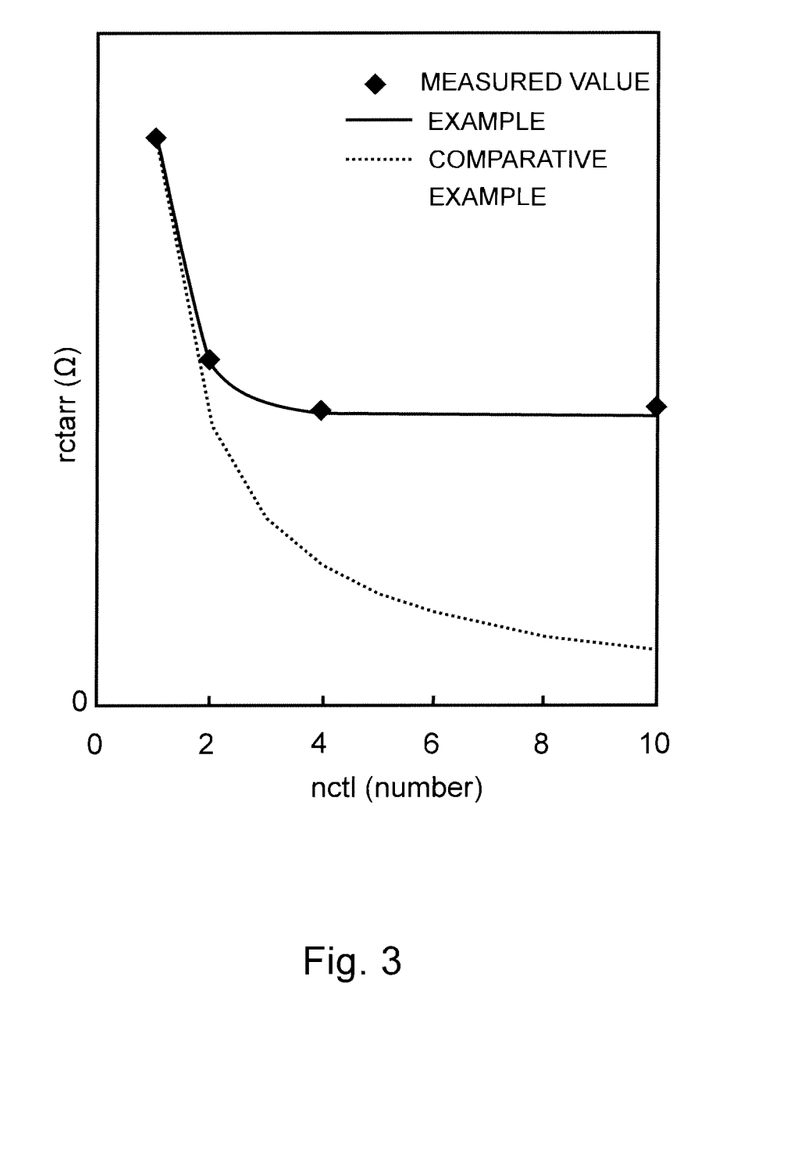
FIG. 3 is a graph showing measured values and simulation results obtained by circuit simulation methods according to an example and a comparative example of the first exemplary embodiment.

Next, simulation results obtained by the circuit simulation method according to the first exemplary embodiment are described hereinafter with reference to FIGS. 3 and 4. FIG. 3 is a graph showing measured values and simulation results obtained by circuit simulation methods according to an example and a comparative example of the first exemplary embodiment. The horizontal axis represents the arrangement number nctl of the contacts CT arranged in the longitudinal direction, and the vertical axis represents the terminal parasitic-resistance rctarr.

In FIG. 3, solid diamond symbols represent measured values of the terminal parasitic-resistance rctarr, a solid line represents the example of the circuit simulation method according to the first exemplary embodiment, and a broken line represents the comparative example. In the comparative example, the terminal parasitic-resistance rctarr is considered to be inversely proportional to the number of the contacts, and is expressed by the following formula (12).

$$rctarr = \frac{rct}{nctl \times nctw} \tag{12}$$

As shown in FIG. 3, the example matches the measured values highly precisely. On the other hand, the comparative example largely deviates from the measured values as the arrangement number nctl of the contacts CT in the longitudinal direction increases. Specifically, the estimation error of the terminal parasitic-resistance rctarr increases. This is because the parasitic resistance ri1 of the resistor 102 between the contacts CT in the longitudinal direction is not considered in the comparative example. Specifically, when the arrangement number nctl of the contacts CT in the longitudinal direction increases, the contacts CT far from the main body of the resistor 102 do not contribute to reducing the terminal parasitic-resistance rctarr.

Figure 4:
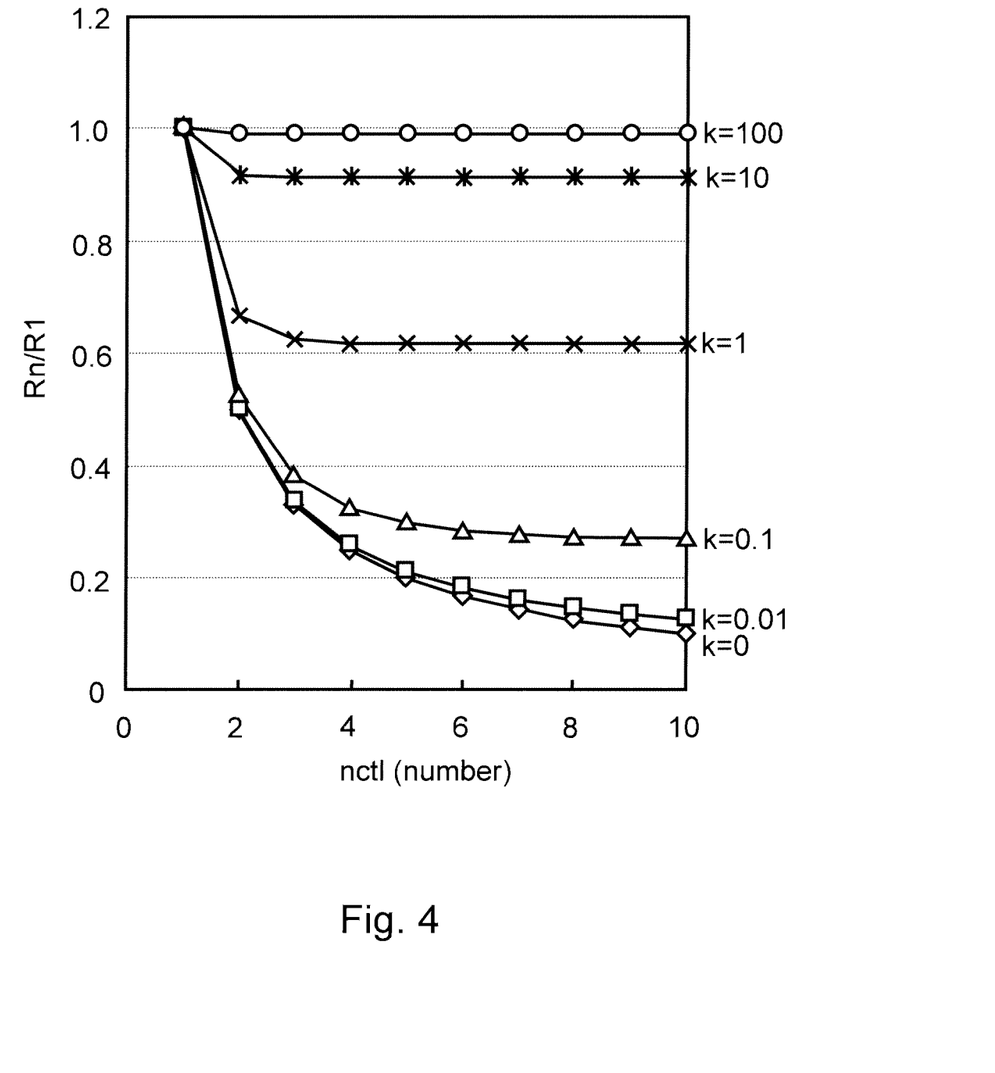
FIG. 4 is a graph showing simulation results obtained by the circuit simulation method according to the first exemplary embodiment.

FIG. 4 is a graph showing simulation results obtained by the circuit simulation methods according to the first exemplary embodiment. The horizontal axis represents the arrangement number nctl of the contacts CT arranged in the longitudinal direction. The vertical axis represents a terminal parasitic-resistance value $R_n$ when nctl=n with respect to terminal parasitic-resistance value $R_1$ when nctl=1, or $R_n/R_1$. Here, k expressed by the formula (10) varies. The formula (12) applied to the comparative example corresponds to the case of k=0. As shown in FIG. 4, the comparative example (k=0) largely deviates from the exact values as k and nctl increase. Thus, the estimation error of the terminal parasitic-resistance rctarr increases.

Second Exemplary Embodiment

Figure 5A:
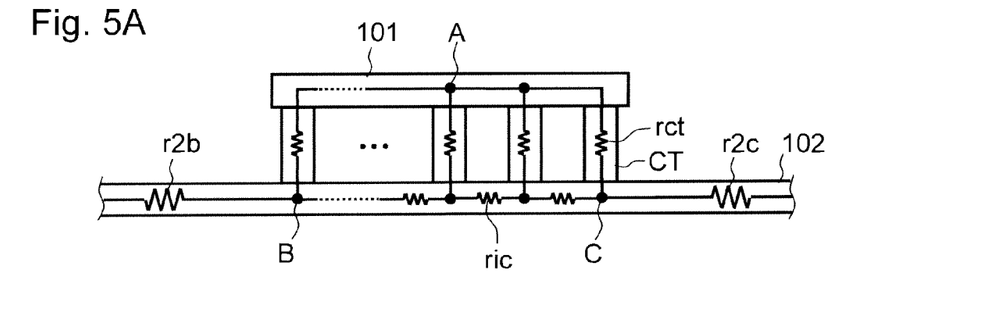
FIG. 5A is a longitudinal sectional view for explaining a terminal parasitic-resistance of a semiconductor resistor which is modeled in a circuit simulation method according to a second exemplary embodiment.
Figure 5B:
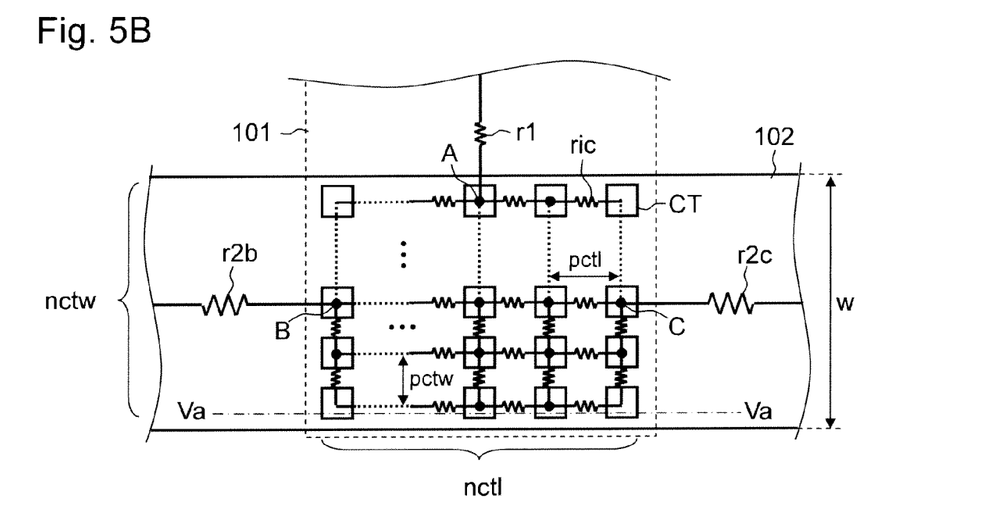
FIG. 5B is a plan view for explaining a terminal parasitic-resistance of a semiconductor resistor which is modeled in the circuit simulation method according to the second exemplary embodiment.

Next, a terminal parasitic-resistance of a semiconductor resistor which is modeled in a circuit simulation method according to a second exemplary embodiment of the present invention is described hereinafter with reference to FIGS. 5A to 5C. FIG. 5A is a longitudinal sectional view for explaining a terminal parasitic-resistance of a semiconductor resistor which is modeled in the circuit simulation method according to the second exemplary embodiment. FIG. 5B is a plan view for explaining the terminal parasitic-resistance of the semiconductor resistor which is modeled in the circuit simulation method according to the second exemplary embodiment. Here, FIG. 5A is a longitudinal sectional view taken along the line Va-Va of FIG. 5B.

In the first exemplary embodiment, the modeled terminal regions are formed at ends of the resistor 102. On the other hand, in the second exemplary embodiment, the modeled terminal region is formed at a center region of the resistor 102. Specifically, the resistor 102 forms a ladder resistor structure composed of resistances r2b and r2c, and the modeled terminal region is formed at a node connecting the resistance r2b to the resistance r2c. Other structures are similar to those in the first exemplary embodiment, and thus description thereof will be omitted. Also in the second exemplary embodiment, the same effects as those of the first exemplary embodiment are obtained.

Figure 5C:
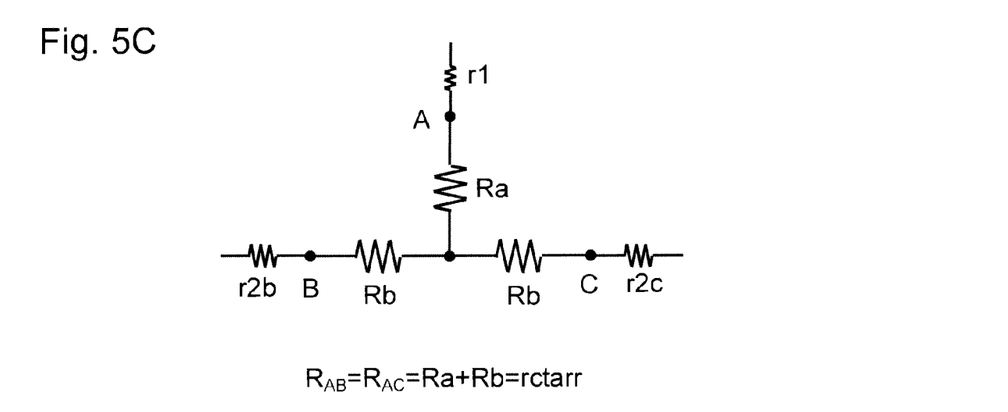
FIG. 5C is an equivalent circuit diagram of a terminal region of a semiconductor resistor which is modeled in the circuit simulation method according to the second exemplary embodiment.

FIG. 5C is an equivalent circuit diagram of the terminal region of the semiconductor resistor which is modeled in the circuit simulation method according to the second exemplary embodiment. As shown in FIG. 5C, the equivalent circuit diagram of the terminal region of the resistor 102 according to the second exemplary embodiment includes a node A connecting the terminal region to the resistance r1 of the main body of the wiring line 101, a node B connecting the terminal region to the resistance r2b of the main body of the resistor 102, and a node C connecting the terminal region to the resistance r2c of the main body of the resistor 102. Therefore, the terminal parasitic-resistance is not expressed as a single resistance, and is expressed by two resistances $R_a$ and $R_b$.

Next, a method for deriving a model formula used for the circuit simulation method according to the second exemplary embodiment is described hereinafter. A resistance between the nodes A and B is expressed as $R_{AB}$ or the like when focusing only on the nodes A and B. Then, in the equivalent circuit shown in FIG. 5C, the resistances $R_a$ and $R_b$ are expressed as the following formula (13).

$$\begin{cases} R_a = R_{AB} - \frac{R_{BC}}{2} \quad \left( = R_{AC} - \frac{R_{BC}}{2} \right) \\ R_b = \frac{R_{BC}}{2} \end{cases} \tag{13}$$

Then, the resistances $R_{AB}$, $R_{AC}$, and $R_{BC}$ are to be solved. With regard to the resistances $R_{AB}$ and $R_{AC}$, naturally, the formula (11) in the first exemplary embodiment is true. Thus, the following formula (14) is obtained.

$$R_{AB} = R_{AC} = \frac{f_{nctl} \times rct}{nctw} \tag{14}$$

Figure 6:
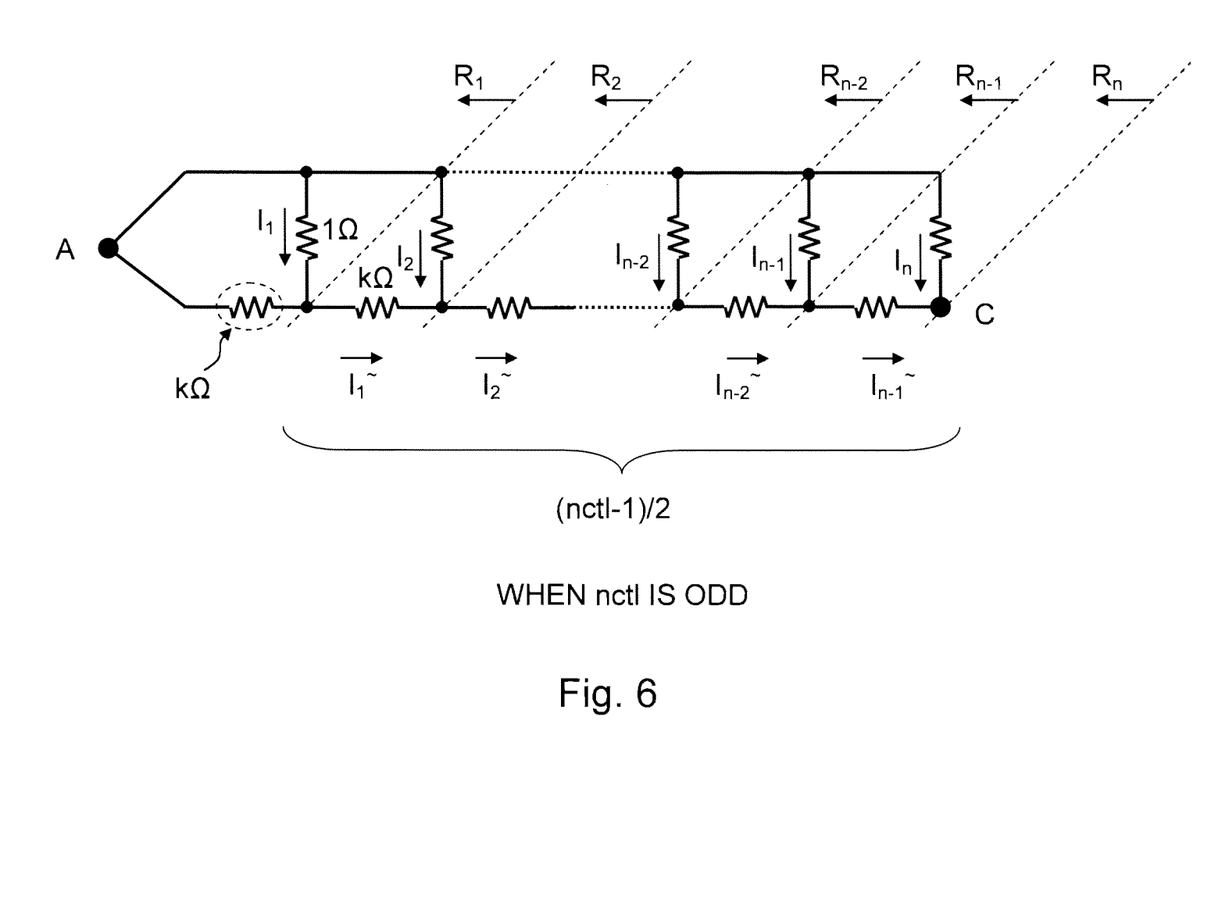
FIG. 6 is a circuit diagram for deriving a model formula in the circuit simulation method according to the second exemplary embodiment.

Next, the resistance $R_{BC}$ is calculated. As shown in FIG. 5A, the longitudinal sectional view is symmetric. Therefore, when considering the resistance $R_{BC}$, voltages of the wiring line 101 and the resistor 102 at the center of the nodes B and C are the same. Therefore, the wiring line 101 and the resistor 102 are considered to be equivalently short-circuited at the node A. Thus, the resistance $R_{BC}$ may be obtained by using only one side (right side) of the equivalent circuit (hereinafter referred to as "right side equivalent circuit") from the node A to the node C. FIG. 6 shows the right side equivalent circuit when the arrangement number nctl (>1) of the contacts CT in the longitudinal direction is odd, and FIG. 7 shows the right side equivalent circuit when the arrangement number nctl of the contacts CT in the longitudinal direction is even.

Figure 7:
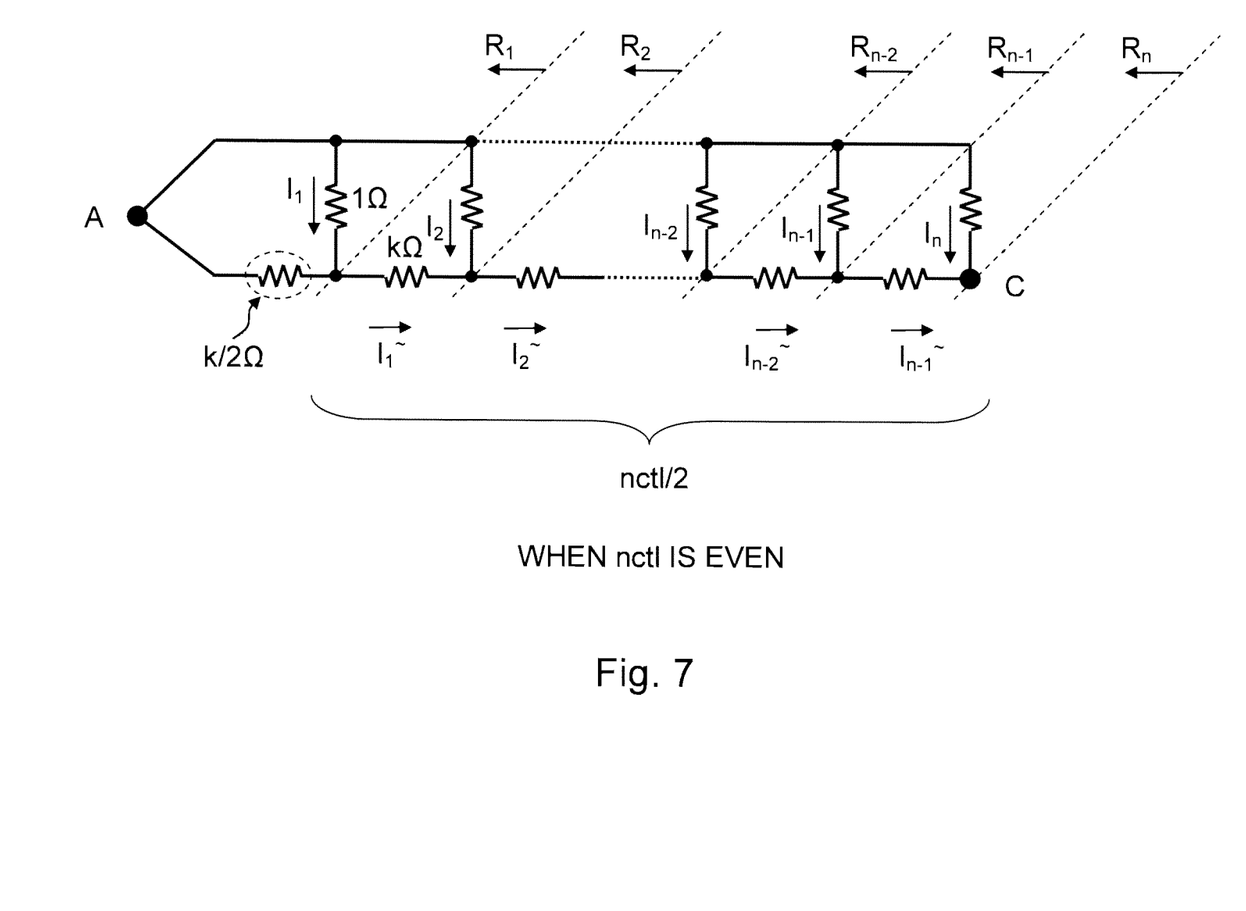
FIG. 7 is a circuit diagram for deriving a model formula in the circuit simulation method according to the second exemplary embodiment.

The value of the resistance $R_{BC}$ is twice the resistance value obtained from the resistance net shown in FIGS. 6 and 7. As shown in FIG. 6, when the arrangement number nctl of the contacts CT in the longitudinal direction is odd, the contact CT at the center does not contribute to the resistance $R_{BC}$. Thus, the number of contacts CT at one side is represented by (nctl−1)/2.

On the other hand, as shown in FIG. 7, when the arrangement number nctl of the contacts CT in the longitudinal direction is even, all contacts CT contribute to the resistance $R_{BC}$. Thus, the number of contacts CT at one side is represented by nctl/2. Note that the parasitic-resistance of the resistor 102 from the node A to the nearest contact CT is half of the normal parasitic-resistance between neighboring contacts.

A resistance $R_{right}$ of the overall right side equivalent circuit is derived as below in a manner similar to the first exemplary embodiment below.
1) When the Arrangement Number nctl of the Contacts CT in the Longitudinal Direction is Odd
Assuming $I_1$=1 in FIG. 6 like in FIG. 2, the formula (1) in the first exemplary embodiment is expressed as the following formula (I-2) in this case. Note that the formulae (2) and (3) are true in this case.

$$\begin{cases} I_1 = 1 \\ I_1^\sim = 1 + 1/k \\ \ldots \\ I_i = k \times I_{i-1}^\sim + I_{i-1} \\ I_i^\sim = I_i + I_{i-1}^\sim \end{cases} \quad (1\text{-}2)$$

Thus, the formula (4) in the first exemplary embodiment is expressed as the following formula (4-2) in this case.

$$\begin{cases} I_1 = 1 \\ I_2 = k + 2 \\ \ldots \\ I_{i+2} = (k+2) \times I_{i+1} - I_i \end{cases} \quad (4\text{-}2)$$

Therefore, the formula (6) in the first exemplary embodiment is expressed as the following formula (6-2) in this case. Note that the formula (5) is true in this case.

$$I_i = \frac{\alpha^i - \beta^i}{\alpha - \beta} \quad (6\text{-}2)$$

Thus, from the formulae (3), (5), and (6-2), the formula (7) in the first exemplary embodiment is expressed as the following formula (7-2) in this case.

$$R_i = 1 - \frac{(\alpha^i - \beta^i) - (\alpha^{i-1} - \beta^{i-1})}{(\alpha^{i+1} - \beta^{i+1}) - (\alpha^i - \beta^i)} \quad (7\text{-}2)$$

A formula (15-1) is obtained from the formulae (7-2) and (8) in the same manner as the formula (11) is obtained in the first exemplary embodiment. Here, to distinguish from the case where nctl is even, $R_i$ in the formula (7-2) is expressed as gi.

$$R_{right} = \frac{g_{(nctl-1)/2} \times rct}{nctw} \quad (15\text{-}1)$$

Thus, the following formula (16-1) is obtained.

$$R_{BC} = 2 \times \frac{g_{(nctl-1)/2} \times rct}{nctw} \quad (16\text{-}1)$$

Since $R_{BC}=0$ when nctl=1 in this formula, which is true, this formula can apply when nctl=1.

From the formulae (13), (14), and (16-1), when the arrangement number nctl of the contacts CT in the longitudinal direction is odd, the values of the resistances $R_a$ and $R_b$ are expressed as the following model formula (17-1).

$$\begin{cases} R_a = (f_{nctl} - g_{(nctl-1)/2}) \times \frac{rct}{nctw} \\ R_b = g_{(nctl-1)/2} \times \frac{rct}{nctw} \end{cases} \quad (17\text{-}1)$$

2) When the Arrangement Number nctl of the Contacts CT in the Longitudinal Direction is Even In a manner similar to the case where nctl is odd, the formula (1) in the first exemplary embodiment is expressed as the following formula (1-3) in this case.

$$\begin{cases} I_1 = 1 \\ I_1^\sim = 1 + 2/k \\ \ldots \\ I_i = k \times I_{i-1}^\sim + I_{i-1} \\ I_i^\sim = I_i + I_{i-1}^\sim \end{cases} \quad (1\text{-}3)$$

Thus, the formula (4) in the first exemplary embodiment is expressed as the following formula (4-3) in this case.

$$\begin{cases} I_1 = 1 \\ I_2 = k + 3 \\ \ldots \\ I_{i+2} = (k+2) \times I_{i+1} - I_i \end{cases} \quad (4\text{-}3)$$

Therefore, the formula (6) of the first exemplary embodiment is expressed as the following formula (6-3) in this case.

$$I_i = \frac{(\alpha+1) \times \alpha^{i-1} - (\beta+1) \times \beta^{i-1}}{\alpha - \beta} \quad (6\text{-}3)$$

Thus, the formula (7) in the first exemplary embodiment is expressed as the following formula (7-3) in this case.

$$R_i = 1 - \frac{(\alpha^i - \beta^i) - (\alpha^{i-2} - \beta^{i-2})}{(\alpha^{i+1} - \beta^{i+1}) - (\alpha^{i-1} - \beta^{i-1})} \quad (7\text{-}3)$$

A formula (15-2) is obtained from the formulae (7-3) and (8) in the same manner as the formula (11) is obtained in the first exemplary embodiment. Here, to distinguish from the case where netl is odd, $R_i$ in the formula (7-3) is expressed as $h_i$.

$$R_{right} = \frac{h_{nctl/2} \times rct}{nctw} \quad (15\text{-}2)$$

Thus, the following formula (16-2) is obtained.

$$R_{BC} = 2 \times \frac{h_{nctl/2} \times rct}{nctw} \quad (16\text{-}2)$$

From the formulae (13), (14), (16-2), when the arrangement number nctl of the contacts CT in the longitudinal direction is even, the resistances $R_a$ and $R_b$ are expressed as the following model formula (17-2).

$$\begin{cases} R_a = (f_{nctl} - h_{nctl/2}) \times \dfrac{rct}{nctw} \\ R_b = h_{nctl2} \times \dfrac{rct}{nctw} \end{cases} \quad (17\text{-}2)$$

While the invention has been described in terms of several exemplary embodiments, those skilled in the art will recognize that the invention can be practiced with various modifications within the spirit and scope of the appended claims and the invention is not limited to the examples described above.

Further, the scope of the claims is not limited by the exemplary embodiments described above.

Furthermore, it is noted that, Applicant's intent is to encompass equivalents of all claim elements, even if amended later during prosecution.

What is claimed is:

1. A simulation method for a semiconductor circuit that comprises:
   a semiconductor resistor;
   a plurality of contacts arranged at regular intervals in a longitudinal direction and in a width direction of the semiconductor resistor on a terminal region of the semiconductor resistor; and
   a wiring line formed on the plurality of contacts,
   the simulation method comprising:
   defining a ratio of a parasitic-resistance of the semiconductor resistor between two of the plurality of contacts neighboring in the longitudinal direction to a resistance of one of the plurality of contacts as a constant k; and
   modeling a parasitic-resistance net by using the constant k, the parasitic-resistance net comprising the terminal region of the semiconductor resistor and the plurality of contacts.

2. The simulation method according to claim 1, wherein the constant k is defined by $$k = \dfrac{\rho spol \times pctl \times nctw}{rct \times w},$$

where
   $\rho spol$ is a sheet resistance value of the semiconductor resistor,
   $pctl$ is a pitch of the plurality of contacts in the longitudinal direction of the semiconductor resistor,
   $nctw$ is the number of contacts arranged in the width direction,
   $rct$ is a resistance value of one of the plurality of contacts, and
   $w$ is a width of the semiconductor resistor at the terminal region.

3. The simulation method according to claim 1, wherein in the modeling, a three-term recurrence formula derived from a relationship of three currents that flow through three contacts neighboring each other in the longitudinal direction is used.

4. The simulation method according to claim 1, wherein in the modeling, the parasitic-resistance of the wiring line positioned immediately above the terminal region is neglected.

5. The simulation method according to claim 1, wherein a width of the semiconductor resistor is constant over the whole of the semiconductor resistor.

6. The simulation method according to claim 1, wherein
   the terminal region is formed at ends of the semiconductor resistor, and
   the parasitic resistance net is modeled, in the modeling, as an equivalent resistance composed of a single resistance series-connected between a resistance of a main body of the wiring line and a resistance of a main body of the semiconductor resistor.

7. The simulation method according to claim 1, wherein
   the terminal region is formed at a center of the semiconductor resistor, and
   in the modeling, the parasitic resistance net is modeled as an equivalent resistance comprising:
   a first partial resistance, one end of which is connected to a resistance of a main body of the wiring line; and
   two second partial resistances, one end of which is connected to the other end of the first partial resistance and the other end of which is connected to a main body of the semiconductor resistor formed at each side of the terminal region.

\* \* \* \* \*